United States Patent
Castelli et al.

(10) Patent No.: US 6,847,315 B2
(45) Date of Patent: Jan. 25, 2005

(54) NONUNIFORM COMPRESSION SPAN

(75) Inventors: Vittorio Castelli, Croton-on-Hudson, NY (US); Peter A. Franaszek, Mt. Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 10/417,707

(22) Filed: Apr. 17, 2003

(65) Prior Publication Data

US 2004/0246152 A1 Dec. 9, 2004

(51) Int. Cl.[7] .............................................. H03M 7/00
(52) U.S. Cl. ........................ 341/87; 341/51; 341/106
(58) Field of Search ........................... 341/50, 51, 106, 341/65; 708/203; 709/231; 707/6, 1, 7, 100, 101

(56) References Cited

U.S. PATENT DOCUMENTS

| | | | | |
|---|---|---|---|---|
| 5,379,036 A | * | 1/1995 | Storer | 341/51 |
| 5,442,350 A | * | 8/1995 | Iyer et al. | 341/51 |
| 5,729,228 A | | 3/1998 | Franaszek et al. | 341/106 |
| 5,864,859 A | | 1/1999 | Franaszek | 701/101 |
| 5,951,623 A | * | 9/1999 | Reynar et al. | 708/203 |
| 6,601,104 B1 | * | 7/2003 | Fallon | 709/231 |

OTHER PUBLICATIONS

Geiger et al. (US applicaiton No. 10/205,590), "Network device with improved storage density and access speed using compression techniques", filed on Jul. 25, 2002.*

* cited by examiner

Primary Examiner—Jean Bruner Jeanglaude
(74) Attorney, Agent, or Firm—McGinn & Gibb, PLLC; Derek S. Jennings (57) ABSTRACT

A method and structure stores and/or transmits and receives data in compressed form. Retrieval latencies are reduced by selectively transmitting a portion of the data in uncompressed form. When the apparatus is part of a computer architecture supporting main memory compression, a selected L2 cache line belonging to the unit of main memory compression is kept uncompressed. To minimize decompression latency, the uncompressed L2 cache line is stored with the compressed-memory directory. Alternatively, the uncompressed L2 cache line is stored in the compressed memory together with the rest of the memory compression unit it belongs to.

35 Claims, 7 Drawing Sheets

NONUNIFORM COMPRESSION SPAN

BACKGROUND OF THE INVENTION

1. Field of the Invention

The present invention relates to a system where digital communication involves compressing the data at the transmitter and decompressing the data at the receiver. The field covers traditional communication systems, such as wireless communication, cable, fiber optic, as well as internal communication between parts of devices or apparatus, such as the communication between processors and between processors and memories in a computer system.

2. Description of the Related Art

In a communication system where data is compressed before transmission and decompressed at the receiver, three kinds of access delays to the uncompressed data are introduced: a delay due to the initialization of the compressor, an initialization delay due to the decompressor, and, if only a portion of the transmitted data is of interest, the time required to decompress the desired data. In many applications, it is desirable to reduce these delays. A typical example is given by a computer system, where compression is used to improve the utilization of certain resources, such as memory and communication bandwidth, but where the compression/decompression delays can impact the overall performance of the system.

These delays are particularly noticeable when universal compression schemes are used, such as the dictionary-based methods commonly known as Lempel-Ziv compression methods, and even efficient parallel versions, such as those described in patent U.S. Pat. No. 5,864,859 and U.S. Pat. No. 5,729,228, the disclosures of which are incorporated herein by reference. These methods compress data by adaptively constructing a dictionary, which is explicitly or implicitly transmitted with the compressed representation of the data. In order to yield good compression ratios, universal data-compression schemes cannot in general be used to compress data portions that are too small, and practically they are used to compress data portions having sizes of 256 bytes or larger. Compression and decompression are sequential (or, when a parallel method is used, sequential within each parallel compressor/decompressor), which implies that the decompression delay is small if the desired data is near the beginning of the compression unit and becomes larger as the position of the desired data approaches the end of the compression unit.

Techniques exist for hiding the effect of the decompression latencies in computer systems, for example the use of large caches, which reduce the number of data requests to the memory. However, when a data request is made, the full latency penalty is paid.

SUMMARY OF THE INVENTION

This disclosure teaches a method for reducing the latency in communication systems where the data compressed at the transmitter, transmitted in compressed form, and decompressed at the receiver. More specifically, the invention selects a small portion of the data to be left uncompressed, uses these data as part of the compression dictionary, transmits that small portion of the data uncompressed, simultaneously compresses the remaining data, and transmits the compressed data after the uncompressed data is transmitted.

The data processing system has a main memory adapted to store data, a data compressor connected to the main memory and a data compressor that includes a dictionary. At least one cache memory is connected to the data compressor and the data compressor is adapted to compress the data received from the cache memory before storing the data in the main memory and decompresses the data retrieved from the main memory device before sending the decompressed data to the cache memory. A central processing unit is connected to the cache memory, the cache memory is adapted to temporarily store data transmitted between the central processing unit and the data compressor. During data compression the data compressor is further adapted to separate uncompressed data to be stored in the main memory into a first portion and a second portion, initializes the dictionary using the first portion of the data, transmits the first portion of the data to the main memory in an uncompressed state, compresses the second portion of the data, and transmits the second portion of the data to the main memory in a compressed state. The data system has a memory line in the main memory, the memory line has multiple cache line sectors and the first portion has a first cache line sector of the memory line. The first portion is the most recently accessed cache line sector of the memory line and is the most frequently accessed cache line sector of the memory line. The system also has counters connected to the data compressor, the counters maintain statistics to determine which cache line sector was most recently accessed and which cache line sector was most frequently accessed. During data decompression, the data compressor is further adapted to retrieving the first portion of the data from the main memory, initializing the dictionary using the first portion of the data, retrieving the second portion of the data from the main memory and decompressing the second portion of the data. The data compressor is further adapted to reorder a position of the first portion with respect to the second portion after the data decompression to reverse any data sector order changes made during the data compression.

The method of the invention compresses and transmits data in a communication system by separating uncompressed data to be transmitted into a first portion and a second portion, initializes a dictionary of a data compressor using the first portion of the data, transmits the first portion of the data in an uncompressed state, compresses the second portion of the data using the data compressor, and transmits the second portion of the data in a compressed state. Transmitting of the first portion of the data is performed simultaneously with the initializing of the dictionary of the data compressor, and simultaneously with the compressing of the second portion of the data. Separating is identifying a most recently requested portion of the data as the first portion. The data has a memory line of a memory device, the memory line comprising multiple cache line sectors and the first portion comprises a first cache line sector of the memory line and the most recently accessed cache line sector of the memory line.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

Figure 1:
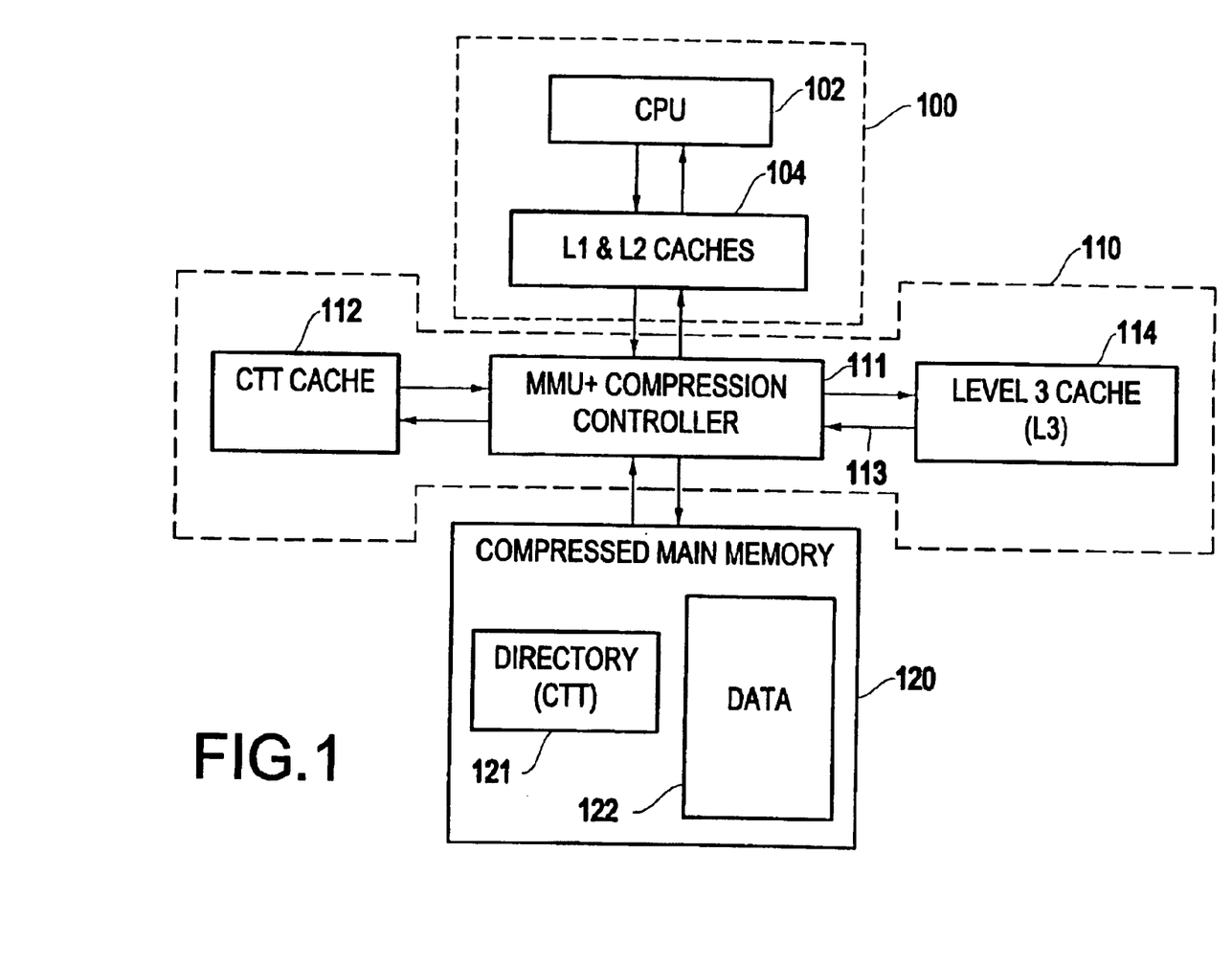
FIG. 1 shows the architecture of a computer system supporting main memory compression.

FIG. 1 depicts an exemplary system having features of the present invention. A computer system can be logically divided into a CPU and cache subsystem (100), a memory subsystem (120) and a memory control unit (110), which provides an interface between the CPU and the memory. The CPU and cache subsystem typically contain the CPU (102), one or more L1 caches, and one or more L2 caches (104). The subsystem also has a Translation Lookaside Buffer (TLB) or a hierarchy of TLBs, which are caches used to translate virtual addresses (as generated by processes) into real addresses (as stored in the caches and manipulated by the MMU). In a compressed-memory system, such as the MXT (Memory Extension Technology) architecture (available from International Business Machines Corporation, Armonk N. Y., USA), the compressed main memory 120 is logically divided into a directory (121) and a data portion (120). The directory is used to translate real addresses (as generated by the processor subsystem) into physical addresses (corresponding to physical locations in the memory). The structure of the CTT is described later in FIG. 2. The data portion of the memory is divided in fixed-size units, called sectors, having typical size of 128 or 256 bytes. Sectors are either used by compressed lines, in which case the CTT-entry of the corresponding compressed line contains pointers to them, or are unused, and organized in a linked list, called free list.

Dictionary-based methods compress data by finding its best match among a collection of strings is called a dictionary. Some methods explicitly maintain a separate dictionary, which is either static or dynamically updated. Other methods, notably the LZ-77 (also called LZ-1) and its parallel version described in patents U.S. Pat. No. 5,864,859 and U.S. Pat. No. 5,729,228, use as compressor dictionary (the collection of all the substrings contained in the portion of the data already compressed, or the collection of all the substrings belonging to a most recently compressed part of the data, said part having predetermined length). These methods typically do not maintain a separate dictionary as a data structure or a device, but directly use the compressed part of the data. Patents U.S. Pat. No. 5,864,859 and U.S. Pat. No. 5,729,228 teach details of the implementation of the dictionary.

The Memory Controller Subsystem (110) comprises a memory management unit (MMU) 111, which in MXT architectures contains the compressor and decompressor, a level 3 cache (L3) 114, a cache 112 (CTT cache) for entries of the compressed main memory directory 121, and a line buffer 113, which contain recently uncompressed memory lines. The unit of compression in the compressed main memory is called a memory line, and typically is a fraction of a memory page. Compressibility and latency tradeoff indicate that an acceptable size for memory lines is 1024 bytes, or 1K.

The invention describes the operation of an MXT computer, where the L3 line size is equal to the memory line size and where the CTT cache and the line buffer are not present. Upon a L2 miss, the memory controller 111 references the L3 cache. If the reference results in a hit, the operation (read or write) is carried out on the cached data. Upon a L3 cache miss, a new line is read from memory and replaces a line currently in the L3 cache. The replaced line is discarded, if clean, and is compressed and written back to memory otherwise. In this case, while the line is compressed, the memory controller retrieves the corresponding CTT-entry from the CTT. If the size of the newly compressed line is the same as the size of its invalid version in memory, the line is written in place. If it is smaller, sectors are released and put on the free list. If it is larger, the appropriate number of sectors are retrieved from the free-sector list. Finally, the CTT-entry is written back in place.

To read a line from memory, the memory controller first retrieves its CTT-entry, decodes it, retrieves the corresponding sectors and decompresses it. When the desired L2 cache line becomes available, it is sent to the L2 (for a read miss), or overwritten within L3 (for a write miss).

Latency on a read from memory includes the average time required to retrieve a CTT entry. This is reduced by the CTT cache. Additional latency is associated with decompression. This includes two components: the time required for initiating the decompression and the additional latency due to the sequential nature of the decompression. One purpose of this invention is to decrease the average time associated with these factors.

Figure 2:
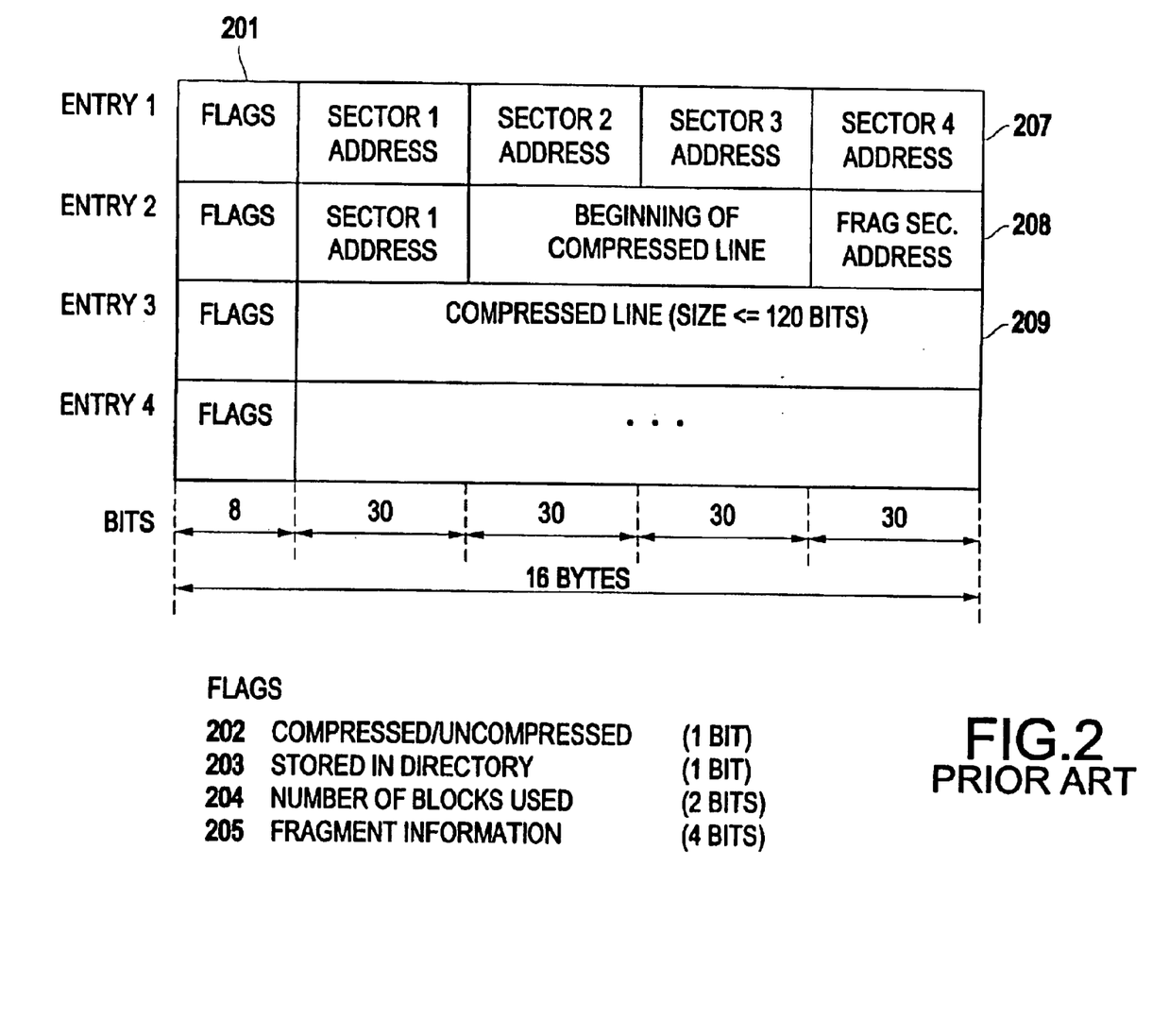
FIG. 2 shows the structure of the memory directory of a computer system supporting main memory compression.

FIG. 2 shows possible organizations of the entries in the compression directory 121. The figure illustrates three different line organizations. Entry 1 (207) contains a set of flags (201), and the addresses of 4 sectors. If the line size is 1024 bytes, and the memory sector size is 256, the line requires at most 4 sectors. Entry 2 (208) contains a set of flags, the address of the first sector used by the line, the beginning of the compressed line, and the address of the last sector used by the line. If the line requires more than 2 memory sectors, the sectors are connected by a linked list of pointers (namely, each memory sector contains the address of the subsequent one e.g., the fragment sector address). Entry 3 contains a set of flags, and a highly compressed line, which compresses to 120 bits or less. The flags in the example are flag 202, indicating whether the line is stored in compressed format or uncompressed, flag 203 indicating if the line is highly compressible and is stored entirely in the directory entry, flag 204 (2 bits) which indicate how many sectors the line uses, flag 205 (4 bits), which contain the fragment information, namely what portion of the last used sector is occupied by the line (this information is used for roommating).

The maximum compression ratio achievable in a system with memory compression that relies on the described compressed-memory organization depends on the size of the directory: the maximum number of real addresses is equal to the number of directory entries in the directory.

Figure 3:
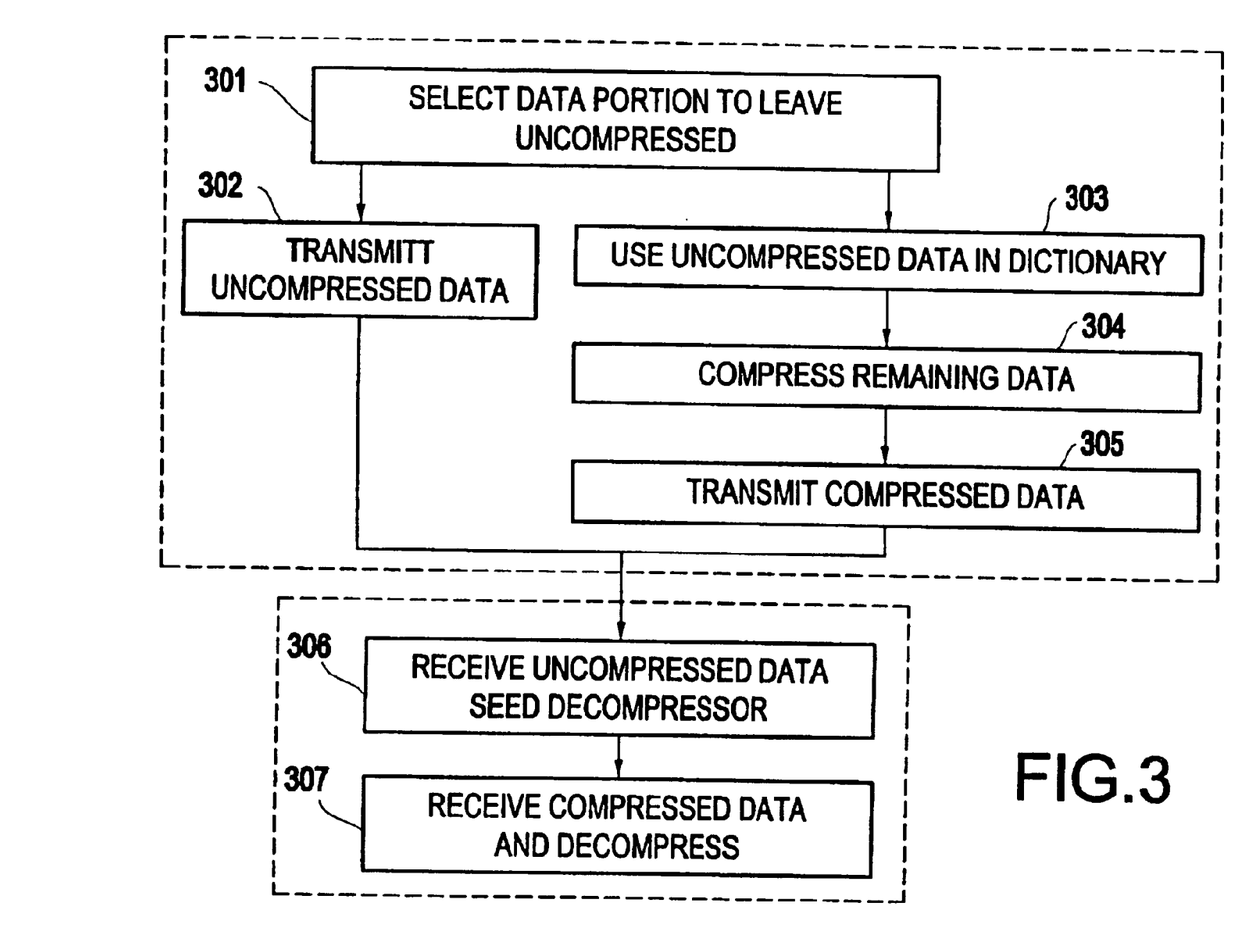
FIG. 3 shows the method for transmitting compressed data where part of the data is kept uncompressed.

FIG. 3 shows the preferred technique for communicating compressed data when a portion of the data is left uncompressed. Steps 301, 302, 303, and 304, and 305 are performed by the sender, while Steps 306 and 307 are performed at the receiver. In Step 301 the sender selects a portion of the data to be left uncompressed. In Step 302 the sender transmits the uncompressed data to the receiver. In Step 303 the sender uses the uncompressed data to initialize the compression dictionary. In Step 304 the sender compresses the remaining data and in Step 306 sends them to the receiver. In a preferred embodiment, Step 302 is performed in parallel with steps 303 and 304 In another preferred embodiment, where parallel processing is not supported, Step 302 is performed before steps 304 and 305. In both embodiments, the transmission of uncompressed data (302) occurs before the transmission of compressed data (305).

The receiver receives the uncompressed data in Steps 305. The uncompressed data is also used to initialize the dictionary of the decompressor. In Step 306 the receiver receives the compressed data and decompresses it with the decompressor. It is important to note that, in general, the selection of which portion of the data to leave uncompressed has little effect on the overall compression ratio achieved by the compressor. It is also important to note that leaving a small portion of the data uncompressed has, in general, little effect on the overall compression ratio: for dictionary-based universal compression methods, the first portion of the data to be compression usually does not compress well, and it is not uncommon to observe situations where the compressed representation of said initial portion of the data requires more bits than its uncompressed version.

In a preferred embodiment, selection Step 301 consists of always selecting the first part of the data to be compressed. More complex strategies are described in FIGS. 4 and 5 with reference to a computer where the content of the memory is compressed. In the embodiments described in reference to FIGS. 4 and 5, the memory controller receives a L2 cache miss from the L2 cache. The size of an L2 cache line is usually significantly smaller than the size of the compression unit, or memory line. The memory controller retrieves the compressed data, and decompresses it. When the portion of the memory line that caused the L2 cache miss is decompressed, it is sent to the L2 cache line, while at the same time the rest of the compressed memory line is decompressed. If the needed portion of the memory line is at the beginning of the memory line, only a small latency penalty is paid. However, if the needed portion is at the end of the memory line, a larger latency penalty is paid.

Figure 4:
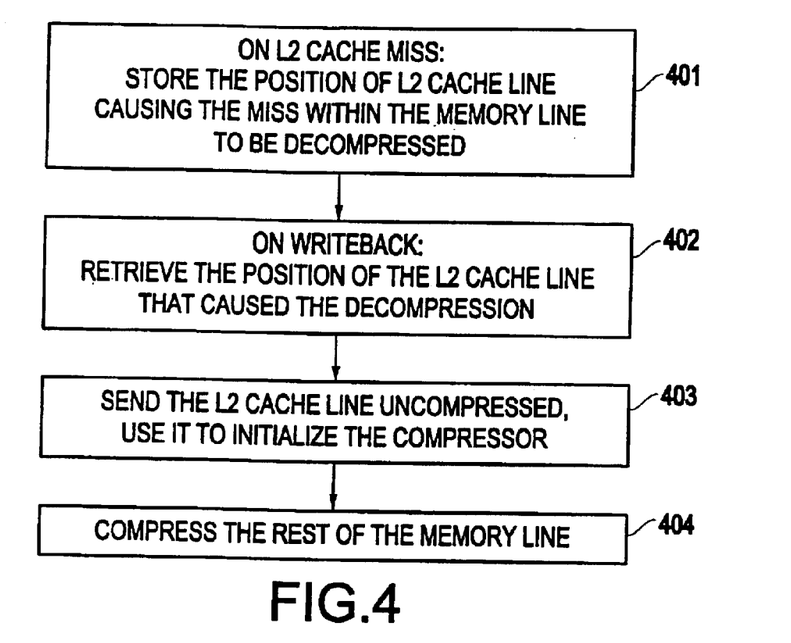
FIG. 4 shows a method for selecting which portion of the data must be kept uncompressed.

In a preferred embodiment, described in reference to FIG. 4, in Step 401 the memory controller stores the position of the memory line causing the L2 cache miss. In general, the size of a memory line is a multiple of the size of a L2 line: for example the L2 cache line could be 64 bytes wide, while the memory line could be 1024 bytes wide. Hence, there are 16 L2 cache lines per each memory line, and the memory controller needs log 2(16)=4 bits to remember the position of the memory line causing the miss. In a preferred embodiment, these 4 bits are stored with the L3 cache line 114. When a L3 cache writeback occurs, the memory controller 111 compresses the memory line containing the one or more L3 cache lines being written back. In Step 402, the memory controller retrieves the position of the L2 cache within the memory line that caused the retrieval of the memory line being written back. In Step 403, the memory controller sends the cache line uncompressed to memory, and uses it to initialize the dictionary of the compressor. In Step 404, the memory controller compresses the remaining part of the memory line being written back, and sends it to memory.

Figure 5:
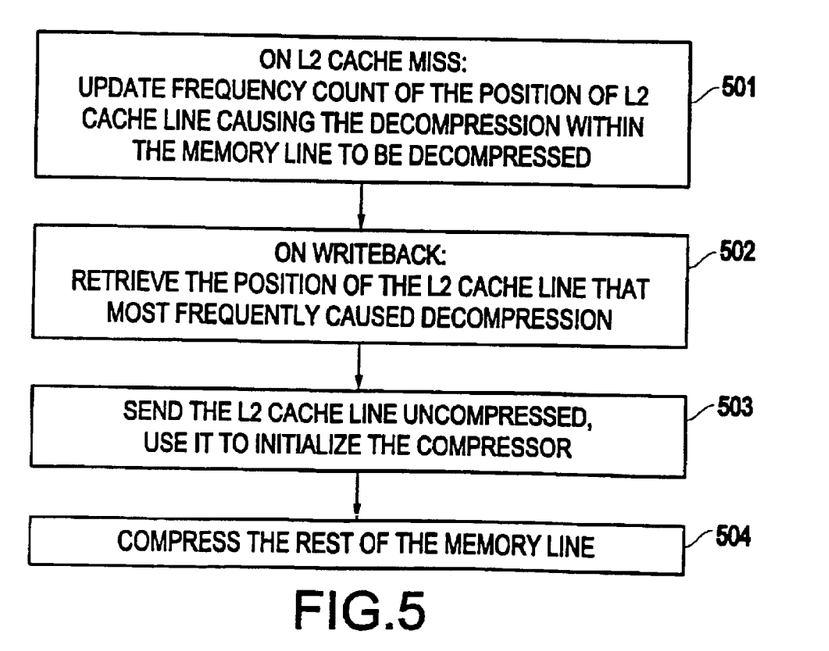
FIG. 5 shows another method for selecting which portion of the data must be kept uncompressed.

In a different preferred embodiment, described in reference to FIG. 5, the memory controller maintains statistics on how frequently the different L2 cache lines within the memory line cause a L2 cache miss that results in decompressing the memory line. In step 501 the memory controller maintains a counter for each L2 cache line portion of the memory line, and increments the counter corresponding to the L2 cache line portion of the memory line that caused the decompression. In step 502, when a writeback occurs, the memory controller uses the counters to identify the L2 cache line portion that most frequently caused decompression. In step 503, the memory controller sends to memory uncompressed the identified L2 cache line portion, and uses it to initialize the dictionary of the compressor. In Step 504, the memory controller compresses the remaining part of the memory line being written back, and sends it to memory. In this embodiment, a persistent copy of the counters is maintained for all portions of all memory lines, and additionally a copy of the counters for each memory line is maintained in a fashion that makes it readily available to the memory controller 111, for example, by storing them in appropriate bytes of the L3 cache 114. In a preferred embodiment, the CTT 112 contains additional space to contain the counters. In another embodiment, the counters are appended to the compressed data. In another preferred embodiment, the counters are stored in a separate data structure in main memory 120.

In the last three described embodiments, it is not important to retrieve the persistent copy of the counters quickly upon decompression, while it is important that they are readily available to the memory controller 111 when a writeback occurs. Therefore, a copy of the counters is maintained readily available to the memory controller 111 for every memory line that is contained in the L3 cache 114.

Figure 6:
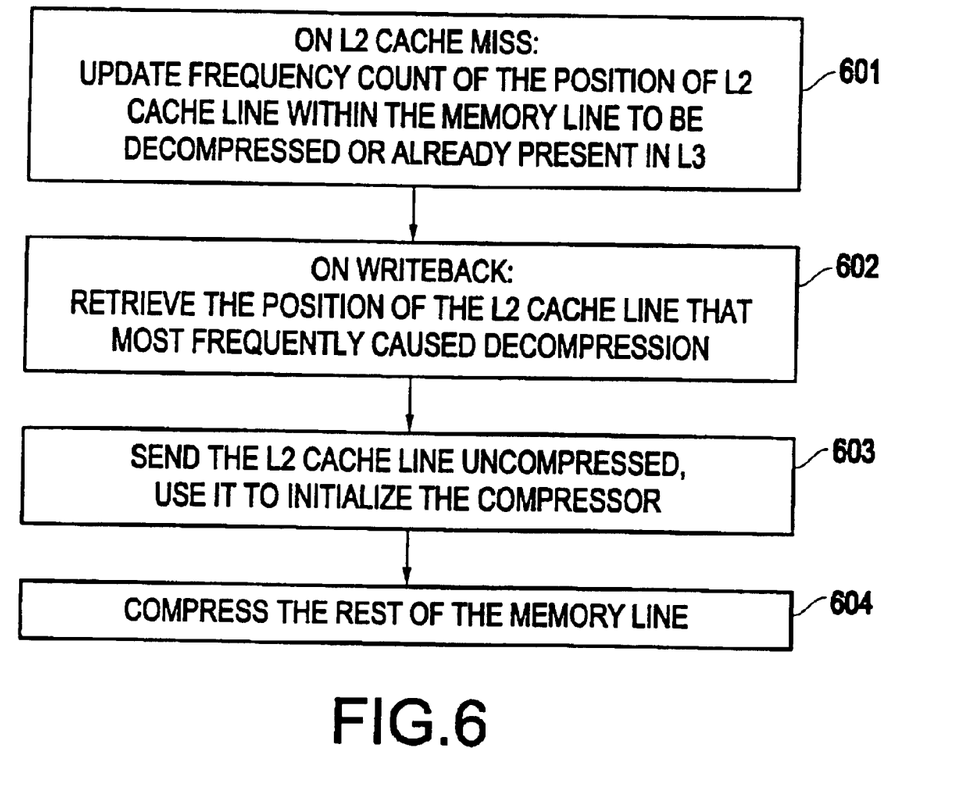
FIG. 6 shows another method for selecting which portion of the data must be kept uncompressed.

In a different embodiment, in Step 601, the memory controller 111 monitors the L2 cache misses that result in either the decompression or in an L3 cache hit. In step 602, when a writeback occurs, the memory controller uses the counters to identify the L2 cache line that most frequently caused an L2 cache miss, either resulting in decompression or in subsequent L3 cache hits. In step 603, the memory controller sends to memory uncompressed the identified L2 cache line, and uses it to initialize the dictionary of the compressor. In Step 604, the memory controller compresses the remaining part of the memory line being written back, and sends it to memory. In this embodiment, the counters are maintained for all portions of all memory lines. It would be apparent to one skilled in the art that the techniques described in the discussion of FIG. 5 to maintain persistent copies of the counters also apply to the embodiments described in reference to FIG. 6. Alternatively, in a different embodiment of FIG. 6 the counters are only maintained for memory lines that are decompressed and reside entirely or partially in L3, and are discarded when the memory line is evicted from L3.

Figure 7:
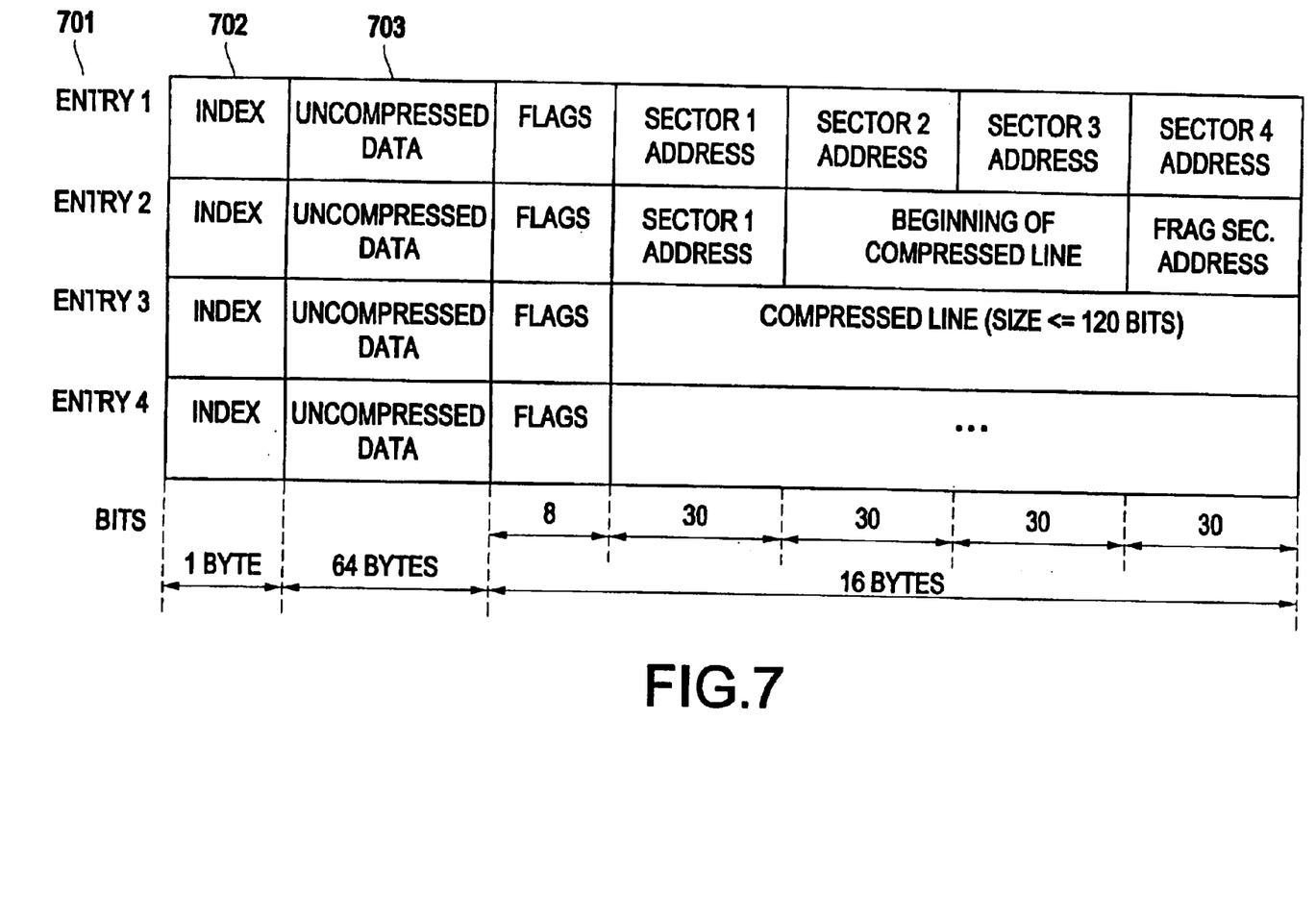
FIG. 7 shows the structure of the compressed memory directory for a compressed-memory computer system where the uncompressed portion of the data is stored in the memory directory.

In a computer system with main memory compression, in a preferred embodiment, the uncompressed data is stored in the conventional data sectors 122 of FIG. 1, along with the compressed data. In another preferred embodiment, described in reference to FIG. 7, the invention provides a memory-compression directory structure that differs from the structure described in reference to FIG. 2, to accommodate the uncompressed data. Each CTT entry 701 contains the index 702 of the uncompressed L2 line portion within the memory line, and space 703 for the uncompressed L2 cache line portion (stored in an integral number of bytes, which in FIG. 7 is one byte), while the rest of the entry is the same as described in FIG. 2. This embodiment has the advantage that the uncompressed data is immediately retrieved from memory, and if the uncompressed data is the desired L2 line portion of the memory line, only a minimal additional latency is incurred over a computer system where the data is stored uncompressed. The only additional latency is due to the additional index information 702. The advantage of positioning the index information 702 before the uncompressed data 703 is that the memory controller 111 can determine whether the uncompressed L2 line is the desired one while the data is being retrieved. In a different embodiment, the index information 702 is stored after the uncompressed data 703. In this embodiment, the memory controller can send the uncompressed line to the L2 cache directly, provided that a mechanism exists to quickly invalidate the data, should the uncompressed data belong to a different L2 cache line other than the one requested.

Figure 8:
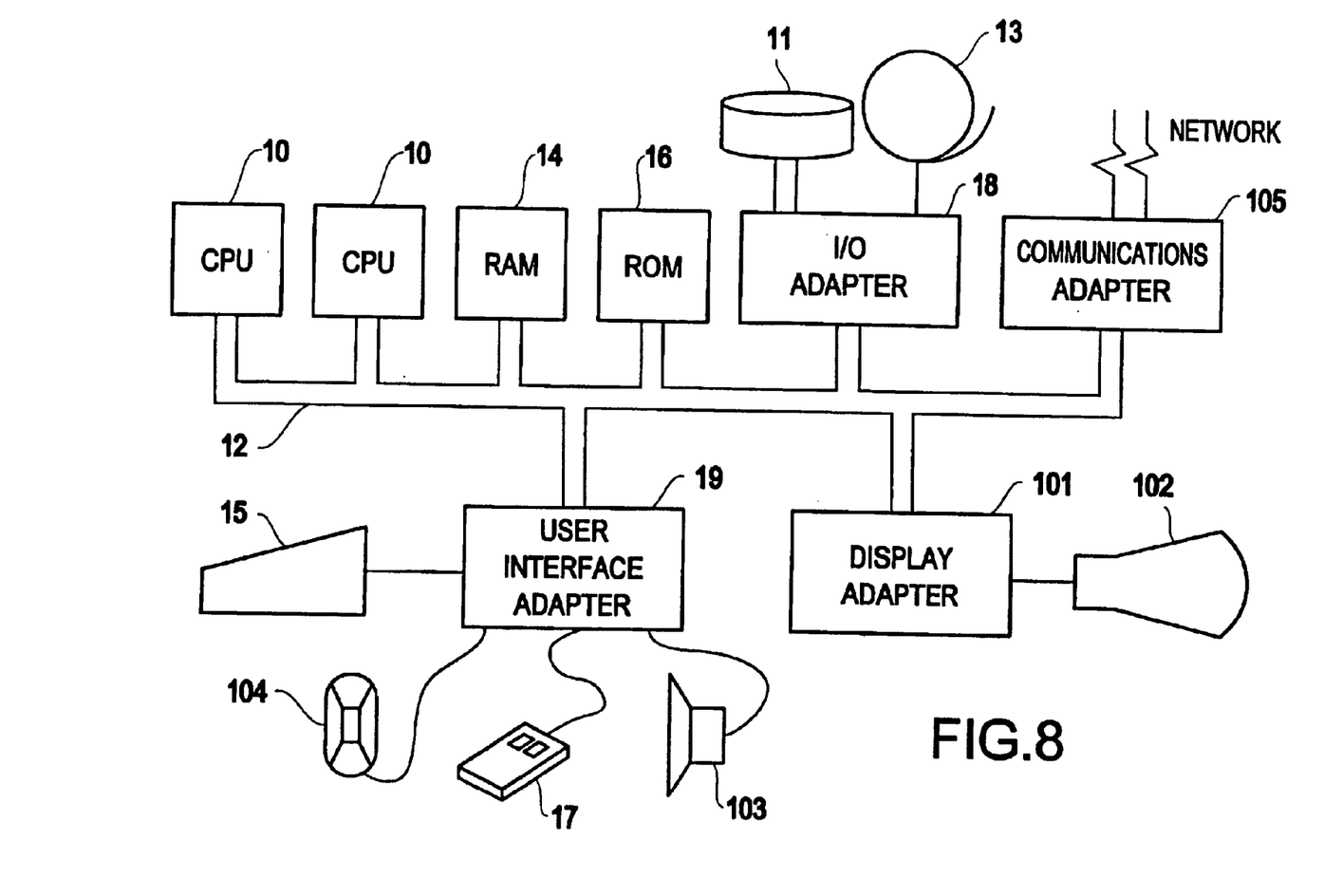
FIG. 8 shows a typical hardware configuration of an information handling/computer system.

A representative hardware environment for practicing the present invention is depicted in FIG. 8, which illustrates a typical hardware configuration of an information handling/computer system in accordance with the subject invention, having at least one processor or central processing unit (CPU) 10. CPUs 10 are interconnected via system bus 12 to random access memory (RAM) 14, read-only memory (ROM) 16, an input/output (I/O) adapter 18 for connecting peripheral devices, such as disk units 11 and tape drives 13, to bus 12, user interface adapter 19 for connecting keyboard 15, mouse 17, speaker 103, microphone 104, and/or other user interface devices such as touch screen device (not shown) to bus 12, communication adapter 105 for connecting the information handling system to a data processing network, and display adapter 101 for connecting bus 12 to display device 102. A program storage device readable by the disk or tape units, is used to load the instructions, which operate the invention also loaded onto the computer system.

The methods as described in terms of preferred embodiments, substantially reduce the latency experienced in retrieving data due to decompression. The invention applies to general communication systems where data is transmitted in compressed form, where the decompression latency is comparable to or larger than the data transmission latency, and where substantial benefits are obtained by quickly retrieving selected parts of the compressed data. Compressed file systems, communication and computer networks, where data is transmitted in compressed form, fall into this category.

While the invention has been described in terms of preferred embodiments, those skilled in the art will recognize that the invention can be practiced with modification within the spirit and scope of the appended claims.

What is claimed is:

1. A data processing system comprising:
a main memory adapted to store data;
a data compressor connected to said main memory, wherein said data compressor includes a dictionary;
at least one cache memory connected to said data compressor, wherein said data compressor is adapted to:
compress said data received from said cache memory before storing said data in said main memory; and
decompress said data retrieved from said main memory device before ending decompressed data to said cache memory; and
a central processing unit connected to said cache memory,
wherein, said cache memory is adapted to temporarily store data transmitted between said central processing unit and said data compressor,
wherein, during data compression, said data compressor is further adapted to:
separate uncompressed data to be stored in said main memory into a first portion and second portion;
initialize said dictionary using said first portion of said data;
transmit said first portion of said data to said main memory in an uncompressed state;
compress said second portion of said data; and
transmit said second portion of said data to said main memory in a compressed state.

2. The system of claim 1, wherein said data comprises a memory line in said main memory, said memory line comprising multiple cache line sectors; and
wherein said first portion comprises a first cache line sector of said memory line.

3. The system of claim 1, wherein said data comprises a memory in said main memory, said memory line comprising multiple cache line sectors; and
wherein said first portion comprises a most recently accessed cache line sector of said memory line.

4. The system of claim 1, wherein said data comprises a memory line in said main memory, said memory line comprising multiple cache line sectors; and
wherein said firs: portion comprises a most frequently accessed cache line sector of said memory line.

5. The system of claim 1, wherein said data comprises a memory line in said main memory, said memory line comprising multiple cache line sectors; and
wherein said system further comprises counters connected to said data compressor, wherein said counters maintain statistics to determine which cache line sector was most recently accessed and which cache line sector was most frequently accessed.

6. The system of claim 1, wherein during data decompression, said data compressor is further a to:
retrieve said first portion of said data from said main memory;
initialize said dictionary using said first portion of said data;
retrieve said second portion of said data from said main memory; and
decompress said second portion of said data.

7. The system of claim 6, wherein said data compressor is further adapted to reorder a position of said first portion with respect to said second portion after said data decompression to reverse any data sector order changes made during said data compression.

8. A data processing system comprising:
a main memory adapted to store data; and
a data compressor connected to said main memory, wherein said data compressor includes a dictionary, wherein, during data compression, said data compressor is adapted to:
separate uncompressed data to be stored in said man memory into a first portion and a second portion;
initialize said dictionary using said first portion of said data;
transmit said first portion of said data to said main memory in an uncompressed state;
compress said second portion of said data; and
transmit said second portion of said data to said main memory in a compressed state.

9. The system of claim 8, wherein said data comprises a memory line in said main memory, said memory line comprising multiple cache line sectors; and
wherein said first portion comprises a first cache line sector of said memory line.

10. The system of claim 8, wherein said data comprises a memory in said main memory, said memory line comprising multiple cache line sectors; and
wherein said first portion comprises a most recently accessed cache line sector of said memory line.

11. The system of claim 8, wherein said data comprises a memory line in said main memory, said memory line comprising multiple cache line sectors; and
   wherein said first portion comprises a most frequently accessed cache line sector of said memory line.

12. The system of claim 8, wherein said data comprises a memory line in said main memory, said memory line comprising multiple cache line sectors; and
   wherein said system further comprises counters connected to said data compressor, wherein said counters maintain statistics to determine which cache line sector was most recently accessed and which cache line sector was most frequently accessed.

13. The system of claim 8, wherein during data decompression, said data compressor is further adapted to:
   retrieve said first portion of said data from said main memory;
   initialize said dictionary using said first portion of said data;
   retrieve said second portion of said data from said main memory; and
   decompress said second portion of said data.

14. The system of claim 13, wherein said data compressor is further adapted to reorder a position of said first portion with respect to said second portion after said data decompression to reverse any data sector order changes made during said data compression.

15. A method of compressing and transmitting data in a communication systems, said method comprising:
   separating uncompressed data to be transmitted into a first portion and a second portion;
   initializing a dictionary of a data compressor using said first portion of said data;
   transmitting said first portion of said data in an uncompressed state;
   compressing said second portion of said data using said data compressor; and
   transmitting said second portion of said data in a compressed state.

16. The method of claim 15, wherein said transmitting of said first portion of said data is performed simultaneously with said initializing of said dictionary of said data compressor, and simultaneously with said compressing of said second portion of said data.

17. The method of claim 15, wherein said separating comprises identifying a most recently requested portion of said data as said first portion.

18. The method of claim 15, wherein said separating comprises identifying a most frequently requested portion of said data as said first portion.

19. The method of claim 15, wherein said data comprises a memory line of a memory device, said memory line comprising multiple cache line sectors; and
   wherein said first portion comprises a first cache line sector of aid memory line.

20. The method of claim 15, wherein said data comprises a memory line of a memory device, said memory line comprising multiple cache line sectors; and
   wherein said first portion comprises a most recently accessed cache line sector of said memory line.

21. The method of claim 15, wherein said data comprises a memory line of a memory device, said memory line comprising multiple cache line sectors; and
   wherein said first portion comprises a most frequently aced cache line sector of said memory line.

22. A method of transmitting and decompressing data in a communication system, wherein said data comprises an uncompressed first portion and a compressed second portion, said method comprising:
   transmitting said first portion of said data from a memory to a data compressor,
   initializing a dictionary of said data compressor using said first portion of said data;
   transmitting said second portion of said data to said compressor; and
   decompressing said second portion of said data using said data compressor.

23. The method of claim 22, wherein said transmitting of said second portion of said data is performed simultaneously with said initializing of said dictionary of said data compressor.

24. The method of claim 22, wherein said first portion of said data comprises a most recently requested portion of said data.

25. The method of claim 22, wherein said first portion of said data comprises a most frequently requested portion of said data.

26. The method of claim 22, wherein said data comprises a memory line of a memory device, said memory line comprising multiple cache line sectors; and
   wherein said first portion comprises a first cache line sector of said memory line.

27. The method of claim 22, wherein said data comprises a memory line of a memory device, said memory line comprising multiple cache line sectors; and
   wherein said first portion comprises a most recently accessed cache line sector of said memory line.

28. The method of claim 22, wherein said data comprises a memory line of a memory device, said memory line comprising multiple line sectors; and
   wherein said first portion comprises a most frequently accessed cache line sector of said memory line.

29. A program storage device readable by machine, tangibly embodying a program of instructions executable by the machine to perform a method of compressing and transmitting data in a communication system, said method comprising:
   separating uncompressed data to be transmitted into a first portion and a second portion;
   initializing a dictionary of data compressor using said first portion of said data;
   transmitting said first portion of said data in an uncompressed state;
   compressing said second portion of said data using said data compressor, and
   transmitting said second portion of said data in a compressed state.

30. The program storage device of claim 29, wherein said transmitting of said first portion of said data is performed simultaneously with said initializing of said dictionary of said data compressor, and simultaneously with said compressing of said second portion of said data.

31. The program storage device of claim 29, wherein said separating comprises identifying a most recently requested portion of said data as said first portion.

32. The program storage device of claim 29, wherein said separating comprises identifying a most frequently requested portion of said data as said first portion.

33. The program storage device of claim 29, wherein said data comprises a memory line of a memory device, said memory line comprising multiple cache line sectors; and wherein said first portion comprises a first cache line sector of said memory line.

34. The program storage device of claim 29, wherein said data comprises a memory line of a memory device, said memory line comprising multiple cache line sectors; and wherein said first portion comprises a most recently accessed cache line sector of said memory line.

35. The program storage device of claim 29, wherein said data comprises a memory line of a memory device, said memory line comprising multiple cache line sectors; and wherein said first portion comprises a most gently accessed cache line sector of said memory line.

* * * * *